(12) United States Patent
Tezuka et al.

(10) Patent No.: US 6,979,408 B2
(45) Date of Patent: Dec. 27, 2005

(54) METHOD AND APPARATUS FOR PHOTOMASK FABRICATION

(75) Inventors: Yoshihiro Tezuka, Saitama-ken (JP); Toshifumi Yokoyama, Saitama (JP); Tsukasa Abe, Santa Clara, CA (US)

(73) Assignees: Intel Corporation, Santa Clara, CA (US); Dai Nippon Printing Co., Ltd., Tokyo (JP)

( * ) Notice: Subject to any disclaimer, the term of this patent is extended or adjusted under 35 U.S.C. 154(b) by 284 days.

(21) Appl. No.: 10/334,662

(22) Filed: Dec. 30, 2002

(65) Prior Publication Data

US 2004/0244912 A1  Dec. 9, 2004

(51) Int. Cl.[7] .............................................. H01L 21/00
(52) U.S. Cl. .......................... 216/67; 216/41; 216/59; 430/5; 430/30; 438/725
(58) Field of Search ............................. 216/41, 59, 67; 430/5, 30; 438/725

(56) References Cited

U.S. PATENT DOCUMENTS

| | | | |
|---|---|---|---|
| 6,335,151 B1 * | 1/2002 | Ausschnitt et al. | 430/322 |
| 6,423,457 B1 * | 7/2002 | Bell | 430/30 |
| 6,583,068 B2 * | 6/2003 | Yan et al. | 438/761 |
| 6,673,520 B2 * | 1/2004 | Han et al. | 430/313 |
| 6,858,361 B2 | 2/2005 | Mui et al. | |
| 2004/0038139 A1 * | 2/2004 | Mui et al. | 430/30 |

OTHER PUBLICATIONS

Takahashi, et al., "Performance of JBX-9000MV with negative tone resist for 130 nm reticle", *Proceedings of SPIE, 20th Annual BACUS Symposium on Photomask Technology*, vol. 4186, pp. 22-33, Sep. 13-15, 2000.

Gujisawa, et al., Evaluation of loading effect of NLD dry etching (2), *Proceedings of SPIE, 20th Annual BACUS Symposium on Photomask Technology*, vol. 4186, pp. 549-552, Sep. 13-15, 2000.

* cited by examiner

*Primary Examiner*—Shamim Ahmed
(74) *Attorney, Agent, or Firm*—Fish & Richardson P.C.

(57) ABSTRACT

The invention provides methods and apparatuses for controlling critical dimension (CD) uniformity of a photomask by neutralizing CD variation associated with pattern density and process fluctuation.

25 Claims, 5 Drawing Sheets

METHOD AND APPARATUS FOR PHOTOMASK FABRICATION

TECHNICAL FIELD

The present invention relates to photomask fabrication.

BACKGROUND

Photomasks may be used to transfer photolithographic patterns onto a substrate during the manufacture of electronic components such as integrated circuits.

The fabrication of a photomask may involve a blanket deposition of an absorber material on a polished transparent substrate. The absorber material is then coated with a photoresist. The photoresist is exposed with a pattern generator. The pattern generator produces a beam, e.g. an electron beam, based on pattern information. This information may include data corresponding to the features to be printed on the photoresist. Following patterning, the photomask is developed to form the desired printed pattern in the photoresist. This pattern is then transferred into the absorber material by subjecting the photomask to chemical processing to remove material other than the desired pattern of absorber material from the substrate.

The pattern printed on a photomask includes a series of lines. The critical dimension (CD) of a photomask is related to the smallest width of a line or the smallest space between two lines permitted in the fabrication of a photomask. Plasma etching for reducing the CD of a photoresist line is termed photoresist trimming and may be used to reduce the CD. Similarly, plasma etching may be used to reduce the CD of a pattern associated with an absorber.

Differences in pattern densities effect CD uniformity during photomask fabrication. Etch loading effect pertains to a phenomenon occurring upon simultaneously etching a pattern of a higher density and a pattern of a lower density: due to a difference in etching rate of a material from one location to another, the amount of reaction products produced by etching becomes locally dense or sparse, and convection of a large amount of reaction products by etching causes a non-uniformity in etching rate. This etch-rate difference leads to CD variation between areas of high pattern density and low pattern density during the manufacture of photomasks.

Critical dimension non-uniformity attributable to etch loading effect has generally been addressed by performing an etching procedure under low pressure conditions. However, even at low pressure, CD non-uniformity of greater than 5 nm can remain. Proximity correction by the controlled application of an electronic beam (e-beam) may alleviate this CD non-uniformity. However, when pattern density variation becomes large this proximity correction technique can promote additional CD non-uniformity amounting to about 10 nm.

DETAILED DESCRIPTION

A reactive species flow is generated and used to modify a material layer on a substrate. The reactive species can be, for example, plasma or ozone generated by alternating electromagnetic radiation fields contacting a gas such as oxygen or other suitable molecule. The modification can include trimming photoresist material trimming and/or etching absorber etching material. The material is modified a particular location in accordance with the pattern density associated with the location. The relative rate of modification at a particular location is reciprocally related to the local pattern density associated with the material layer on the substrate.

Figure 1:
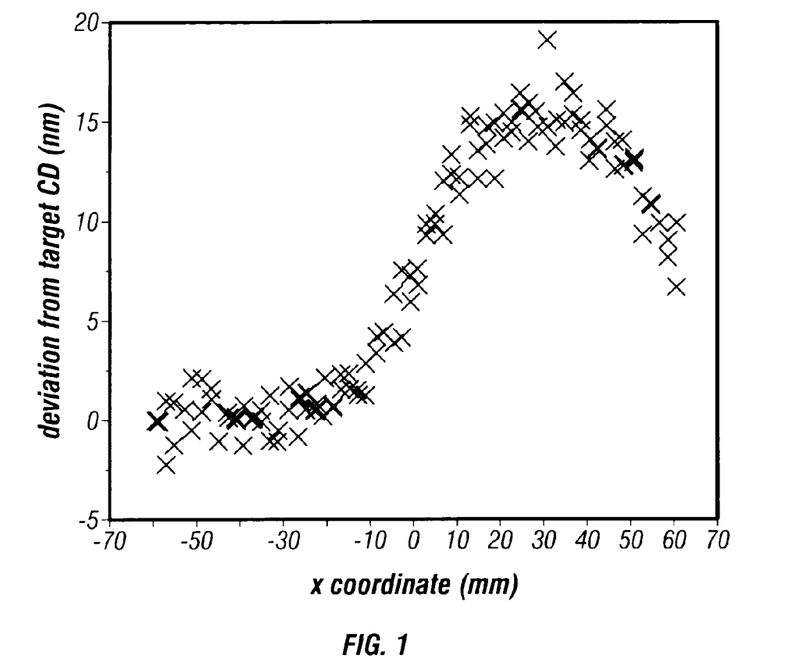
FIG. 1 depicts a plot of CD variation during photomask manufacture.

FIG. 1 shows the effect of local pattern density on critical dimension (CD) uniformity. The graph shows CD variation as a function of the x-coordinate when absorber density is less than 10% in the area of x<0 and absorber density is greater than 90% in the area of x>=0. The graph shows that CD deviates from target CD at x>0.

Figure 2:
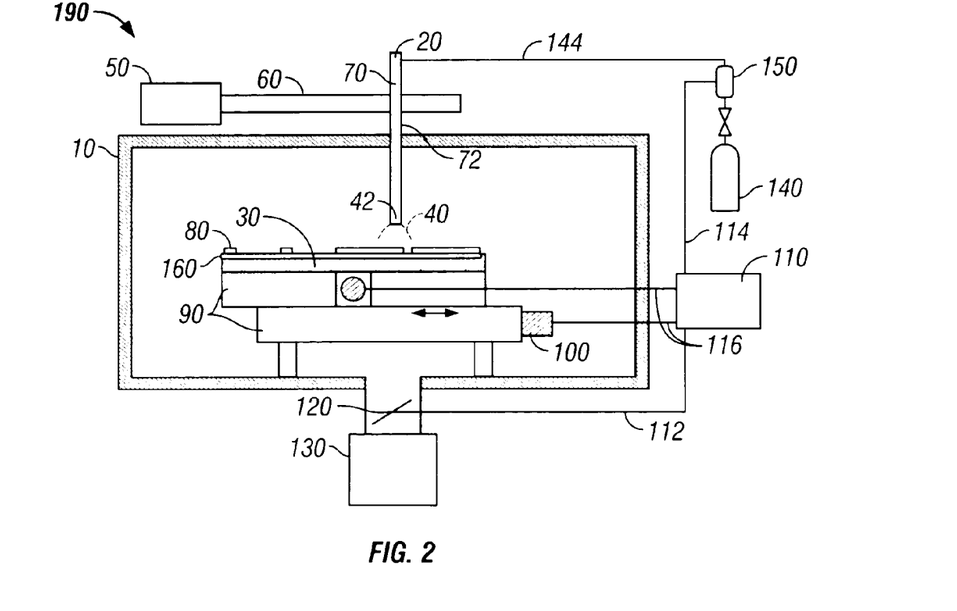
FIG. 2 depicts an apparatus for modifying a photoresist material.

FIG. 2 illustrates a process and apparatus for photoresist 80 modification. A photoresist material 80 is generally positioned in proximity to an absorber material 160 supported by an underlying substrate 30. The substrate 30 may be any substrate formed from any suitable material which is transparent, rigid, thermally stable (low thermal expansion) and durable, including silica, quartz, calcium fluoride ($CaF_2$) and other materials well known in the art. A photoresist material 80 can be patterned by a conventional direct-write technique, such as electron beam (e-beam) exposure or laser exposure at the i-line wavelength (365 nm). The pattern is then replicated into the absorber layer by etching the absorber layer 160 in locations not covered by the photoresist 80 to form an etched absorber pattern. The photoresist 80 is then selectively removed. The photoresist 80 may be trimmed or etched using any suitable technique. For example, Reactive Ion Etching (RIE), Magnetic Enhanced Reactive Ion Etching (MERIE), Electron Cyclotron Resonance (ECR), and inductive RF etching are techniques known to those skilled in the art.

Apparatus 190 provides a mechanism for trimming or etching a material associated with a photomask. The material may be, for example, a photoresist material 80 or an absorber material 160. The amount of effect depends on the length of time a reactive species flow contacts a material associated with a photomask. This is integrated with the distribution of the reactive species flow. The length of time that a reactive species flow contacts the material at a given location is based upon the continuous movement of the flow relative to the material. Alternatively, the length of time that a reactive species flow contacts the material at a given location may be calculated based upon the discontinuous movement of the flow relative to the material. The discontinuous movement may be controlled so that the movement of the reactive species flow may be stopped. Material at the coordinate is then etched.

The continuous or discontinuous movement of the reactive species flow may be accomplished by a movable stage 90 capable of moving in an x or y direction in a controlled manner. For example, a material such as a photoresist 80 associated with a photomask 30 is contacted by a reactive species flow 40. The photomask may be associated with a movable stage 90 that moves in a predetermined manner. The stage and associated photomask move in an x or y dimension such that the position of the reactive species flow in contact with the material is altered according to the movement of the stage.

Figure 7:
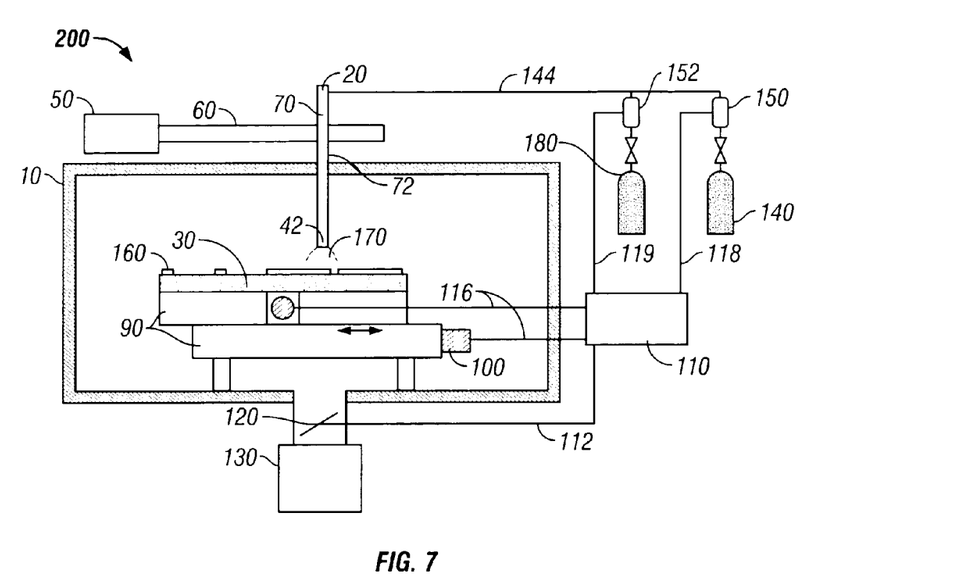
FIG. 7 depicts an apparatus for modifying an absorber material.

To generate a reactive species flow, such as a plasma, alternating electromagnetic radiation fields are generated by generator 50. The generator is connected to a cavity 60. The cavity is connected to connector 20 at 70. For apparatus 200, a combination of gases suitable for generating a plasma capable of etching an absorber are introduced connector 20. For example, oxygen gas 140 and chlorine gas 180 can be introduced into the connector 20 to generate a reactive species flow. While oxygen and chlorine gas are provided as examples, it is understood that any gas or gas mixture suitable for etching a particular absorber material can be used in the method and apparatus of the invention. For apparatus 190 and 200 the controllers 150, 152 are connected to computer 110 which controls the amount of gas introduced into pipe 144 connected to connector 20.

Figure 3:
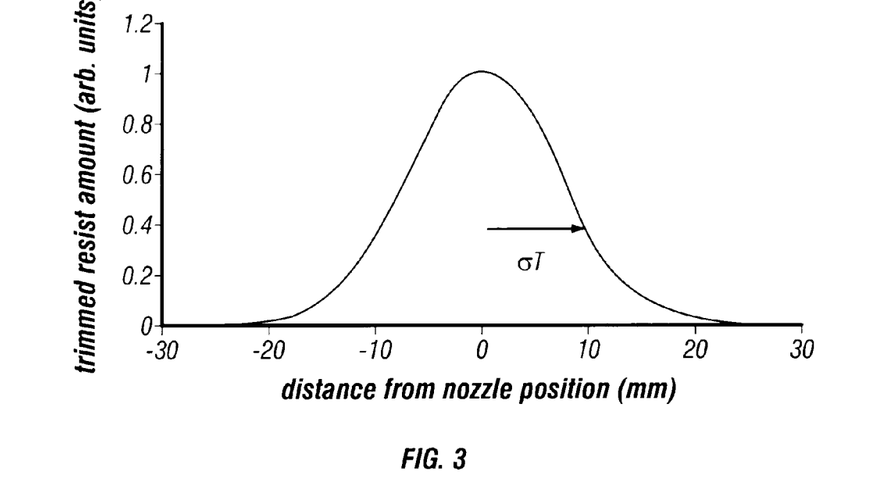
FIG. 3 depicts Gaussian shaped reactive species flow density distribution during photoresist trimming.

The distribution of a reactive species flow may be controlled by controlling the amount of gas flow 150 into applicator 20 or by modulating the distance between outlet 42 and the photoresist material 80 associated with the photomask. The reactive species flow in contact with the photomask demonstrates a Gaussian distribution of reactive species flow with the center of distribution located in proximity to the reactive ion outlet which is in proximity to the material being etched. FIG. 3 shows that the amount of photoresist material removed from the photomask is functionally-related to the proximity of the connector outlet with regard to the target photoresist.

Figure 4A:
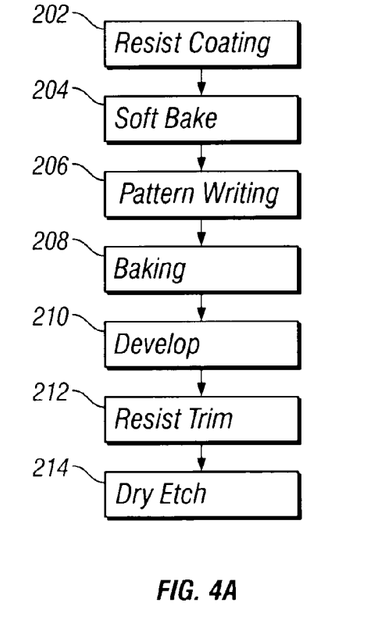
FIG. 4A is a flow diagram of a procedure for modifying CD deviation by photoresist trimming.
Figure 4B:
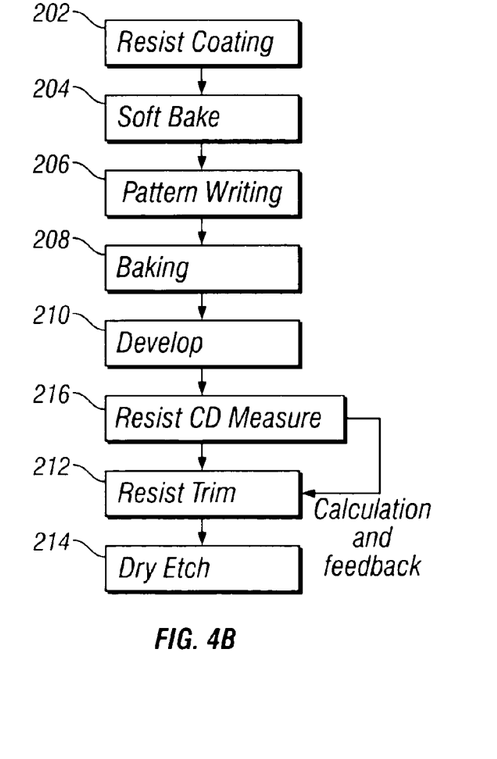
FIG. 4B is a flow diagram of a procedure for modifying CD deviation by photoresist trimming subsequent to CD measurement.
Figure 5:
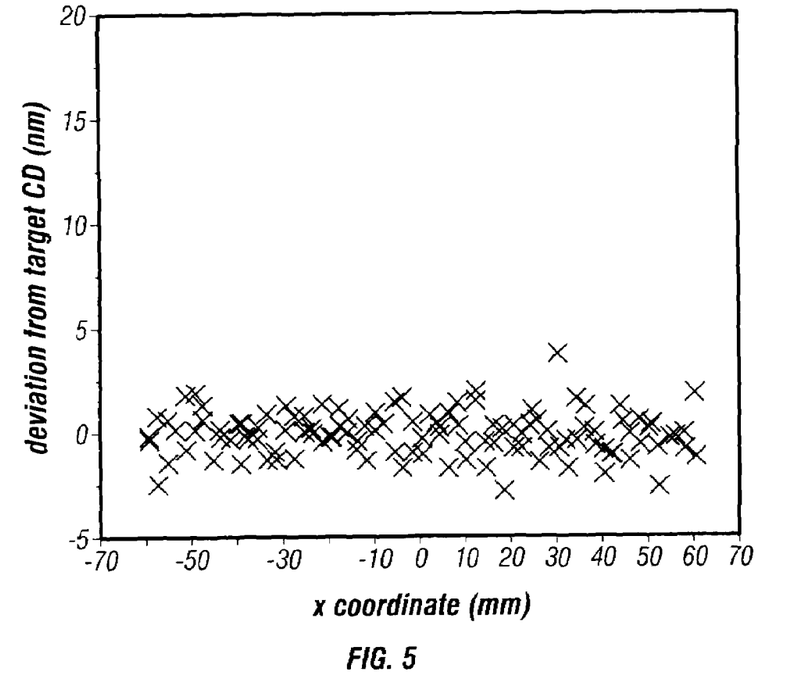
FIG. 5 depicts a plot of CD variation subsequent to photoresist modification.

Photoresist material may be trimmed to compensate for CD non-uniformity associated with pattern density loading effects. FIG. 4A illustrates exemplary procedures involved in photomask manufacture and photoresist modification. A photoresist material can be coated 202 on a photomask followed by a soft bake 204, patterning writing 206 and further baking 208. The photoresist can be subsequently developed 210 and the photoresist material trimmed 212 based upon pattern density. The modified photoresist pattern can then be transferred to an absorber material by an etching process 214. As shown in FIG. 4B, photoresist modification can occur subsequent to CD measurement of the photoresist 216. FIG. 5 illustrates that photoresist modification can result in uniform CD variation when compared to a target CD.

Figure 6:
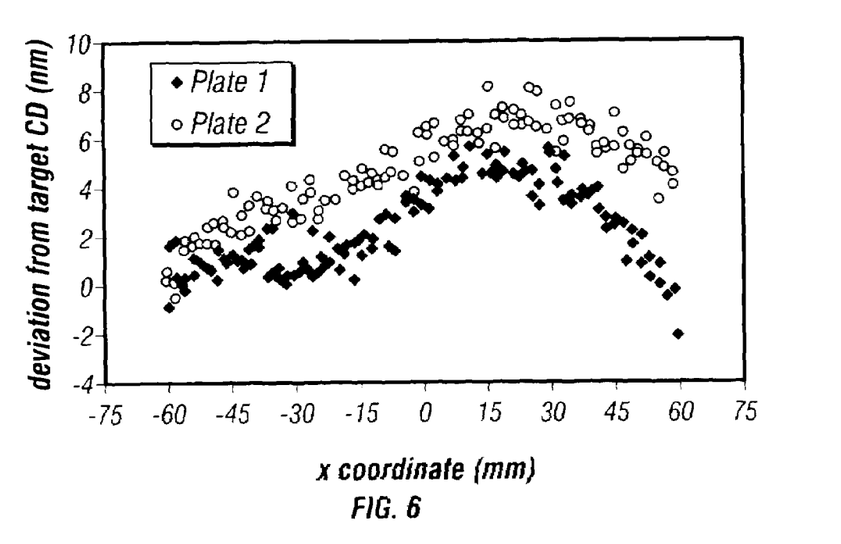
FIG. 6 depicts a plot of CD variation obtained from two photomasks with the same pattern but processed on different dates.

FIG. 6 illustrates how CD non-uniformity produced by process fluctuations during the manufacture of multiple photomasks may be problematic. These fluctuations can be attributable to resist sensitivity fluctuation, baking fluctuation or dry etch fluctuation. Even when steps are taken to modify the CD of a particular photomask based upon a model, photomask-to-photomask CD variation usually remains. FIG. 6 depicts a plot of CD variation obtained from two photomasks with the same pattern but processed at different times. CD non-uniformity between photomasks cannot be modified by pattern writing compensation. For example, the deviation from a target CD observed in the graph depicted in FIG. 6 can be modified by writing compensation for individual photomasks. However, this process is less useful for correcting photomask defects from photomask to photomask. The present methods and apparatuses address photomask to photomask defects by controlling CD uniformity of a material associated with a photomask by neutralizing CD variation associated with photomask manufacture.

FIGS. 2 and 7 illustrate apparatuses useful for modifying a material associated with a photomask, such as a photoresist material or absorber material. Generally, a vacuum pump 130 connected to an outlet 122 controlled by a valve 120 integrally-associated with chamber 10 regulates the pressure inside chamber 10. For example, a turbo-molecular pump 130 can be used to evacuate gas in a chamber 10 in photomask fabrication. Generally, the pump is required to evacuate gas in the chamber at a high rate, keep the chamber under a predetermined pressure or less, and have a high compression capability.

An apparatus 190 (FIG. 2) or 200 (FIG. 7) for trimming or etching a material on a substrate 30 includes a plasma reaction chamber 10 for generating a plasma 40. The material on a substrate 30 can be, for example, a photoresist 80 (FIG. 2) or an absorber material 160 (FIG. 7). Substrate 30 can be, for example, a quartz substrate for use as a lithography photomask.

In one embodiment, a substrate 30 comprising an absorber material 160 and photoresist material 80 having a pattern on it is placed on a movable transport stage 90. The stage 90 can move in an x-y plane using an x-y linear motor 100 controlled by computer 110. Plasma 40 contacts the photoresist 80 in proximity to outlet 42 of connector 20. The plasma trims the photoresist 80 thereby reducing the line CD of the photoresist and increasing the space CD of the photoresist. The time-integrated plasma distribution at a location on the photomask is proportional to the amount of line resist CD reduction required for that location. Plasma distribution depends, in part, on the velocity of the photomask associated with a movable stage in an x or y dimension. A process flow for photoresist modification by a method or apparatus of the invention is shown in FIGS. 4a and 4b.

The movable stage can include a first portion for moving in an x dimension connected with a second portion that is movable in a y dimension with respect to the first portion. The movable stage can move in a continuous or discontinuous manner. The apparatus can include a position detection system that detects the position of said stage and a controller that is connected with a linear motor that functions to move the stage. The controller can be, for example, a computer programmed to facilitate a relationship between an output of the position detection system and a positional relation of the movable with regard to the reactive species flow in contact with the photomask associated with the movable stage.

When moving the photomask in an x dimension at a specified velocity the y coordinate can remain fixed. The photomask can then be moved in a +y dimension at a predetermined velocity for a fixed distance (d). Subsequently, the photomask can move in a −x direction at a predetermined velocity. The distance (d) is a function of the distribution of reactive species flow in contact with the photomask. Distance (d) can be equal to, or less than, the standard deviation of the distribution of reactive species flow in contact with the material associated with the photomask.

To generate a plasma, radiation is provided by an a generator 50 for generating alternating electromagnetic radiation fields. A generator can include an m-wave generator, a radio frequency (RF) generator, or an ultraviolet (UV) radiation generator such as a UV source. The generator is connected to a guide 60. The guide is connected to connector 20 at 70. For apparatus 190, the oxygen gas 140 is introduced into connector 20 to generate oxygen plasma at the connection 70. Alternatively, a UV source can be used to generate ozone instead of oxygen plasma in the guide. For apparatus 200, a combination of gases suitable for generating a plasma capable of etching an absorber are introduced into connector 20. For apparatus 190 and 200 the controllers 150, 152 are connected to computer 110 which controls the amount of gas introduced into pipe 144 connected to connector 20.

In another embodiment, an apparatus for etching an absorber material to compensate for CD non-uniformity is provided. FIG. 7 (apparatus 200) shows that etching can be used for pattern transfer to an absorber material and generally involves the selective removal of portions of a given layer. The thickness of the absorber layer 160 is primarily determined by the radiation absorption of the material used as the absorber. The absorber layer 160 may be made of any suitable material that is absorptive of radiation at the wavelength used in the imaging system and that can be selectively etched. The absorber layer 160 may be made of any material or composition that meets these criteria, such as, for example, chromium (Cr), tantalum (Ta), tantalum nitride (TaN), and tantalum boron nitride (TaBN). Typically, if TaN is used, the thickness of the absorber layer 160 may be in the range of 50 to 100 nm.

Apparatus 200 (FIG. 7) includes a connector 20 that traverses the wall of the reaction chamber 10 at 72. The connector 20 is proximally connected to a guide 60 which is operationally associated with a radio frequency (RF) generator 50. Electrons are accelerated in the cavity 60 and collide with other molecules, such as oxygen gas 140 and chlorine gas 180 in the connector 20 to produce ions, neutral radicals, and more electrons. The amount of gas flowing into connector 20 is regulated by mass flow controllers 150, 152. The gas flows from controllers 150, 152 to connector 20 through pipe 144. For example, a combination of gases 140, 180 may be introduced into the connector 20. The amount of gas flowing into connector 20 is regulated by a mass flow controllers 150, 152. The gases flow from controllers 150, 152 to connector 20 through pipe 144.

FIG. 7 shows a substrate 30 comprising an absorber 160 having a pattern on it is placed on a transport stage 90 subsequent to resist removal and CD measurement. The stage can translocate in an x-y plane using an x-y linear motor 100 controlled by computer 110. A reactive species flow such as a plasma 170 contacts the absorber 160 in proximity to outlet 42 of connector 20. The plasma etches the absorber 170 thereby reducing the line CD of the absorber and increasing the space CD of the absorber. The time-integrated plasma distribution at a location on the photomask should be proportional to the amount of line absorber CD reduction required for that location as determined by the CD measurement.

Figure 8:
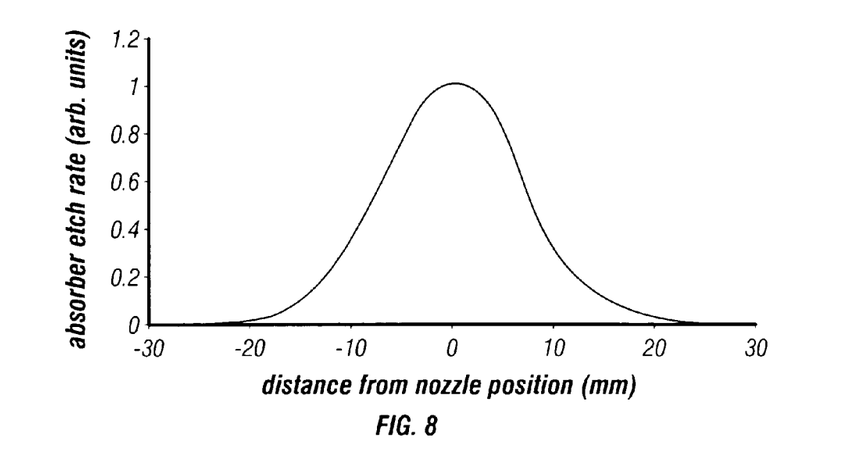
FIG. 8 depicts Gaussian shaped reactive species flow density distribution during absorber etching.

FIG. 8 illustrates that the amount of absorber material removed from the photomask can be functionally-related to the proximity of the connector outlet to the target absorber. The reactive species flow distribution is Gaussian with the center, or 0 point, located immediately below the connector outlet. Reactive species flow distribution in contact with the absorber can be controlled by modifying the distance between outlet 42 and absorber material 160. In addition, flow distribution is controllable by other process parameters such as chamber pressure, gas flow and gas mixture.

Figure 9A:
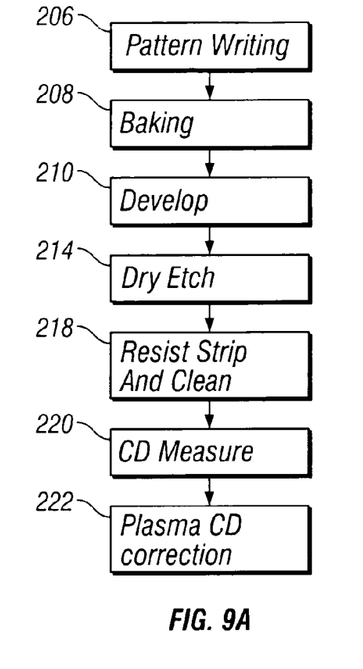
FIG. 9A is a flow diagram of a procedure depicting for modifying CD deviation of a photomask by absorber etching.
Figure 9B:
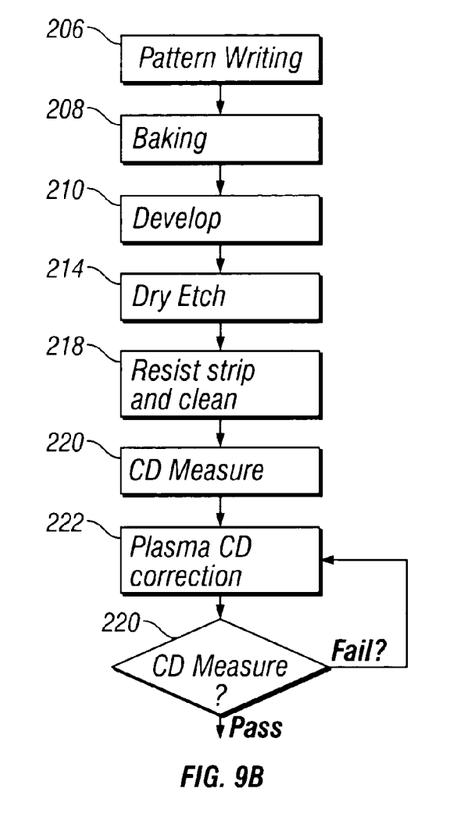
FIG. 9B is a flow diagram of a procedure for modifying CD deviation of a photomask by absorber etching following CD re-measurement and correction.
Figure 10:
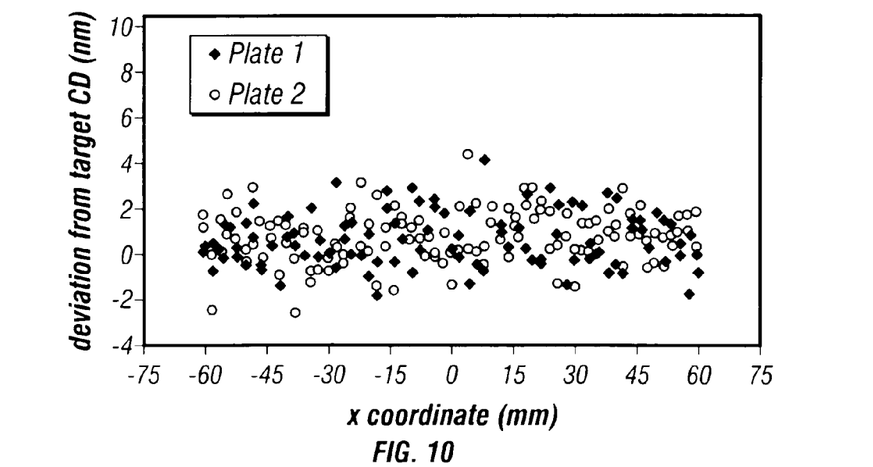
FIG. 10 depicts a plot of CD variation obtained from two photomasks with the same pattern but processed on different dates following absorber modification.

A process flow for absorber modification is illustrated in FIGS. 9*a* and 9*b*. FIG. 9A illustrates exemplary procedures involved in absorber modification. An absorber material can be patterned 206, baked 208, developed 210 and dry etched according to techniques known in the art. Subsequently, the photoresist material is stripped from the absorber material 218 and the CD of patterned absorber can be measured 220. The absorber material can be modified 222 to correct any deviation from a target CD. As illustrated in FIG. 9B, a second CD measurement can be made subsequent to absorber modification. The modification process can be used repeatedly until CD non-uniformity is resolved. FIG. 10 illustrates the CD variation obtained from two photomasks with the same pattern but processed on different dates. The graph demonstrates that CD uniformity from photomask to photomask is modifiable by methods and apparatuses provided herein.

In other embodiments, methods of controlling CD uniformity of a photomask by neutralizing CD variation associated with etch loading effect are provided. The methods relate to mathematically modeling pattern density associated with a photomask and integrating this information with a change of position of a reactive species flow in an x or y dimension of the photomask. For example, the pattern density associated with a photoresist or absorber on a photomask can be determined from the pattern information used to direct pattern writing. Alternatively, the pattern density can be determined by generating an image of a location on a photomask comprising a pattern and calculating the number of structures per unit area.

Pattern density can be used to generate a velocity map that defines the dimension and rate (i.e., speed) of movement (i.e., change of position) of the reactive species flow in contact with the material. The methods integrate the mathematical convolution of pattern density with reactive species flow movement and distribution having a standard deviation of about 15 mm. The velocity map provides for the trimming or etching of a material associated with a photomask based upon the continuous movement of a reactive species flow in an x or y dimension. For example, the reactive species flow may be in continuous motion during the trimming or etching process. The speed at which the reactive species flow changes position is determined, in part, by the density of the pattern associated with the material being traversed by the flow. Generally, the slower the movement of the reactive species flow the greater the amount of material that will be trimmed or etched in that area of the photomask.

Similarly, the velocity map provides for the trimming or etching of a material associated with a photomask based upon the discontinuous movement of a reactive species flow in a +/−x or +/−y dimension. For example, the reactive species flow may move from point to point on the photomask in a discontinuous manner. The amount of material to be trimmed or etched at a particular point may be calculated, in part, on the pattern density at that point. The reactive species flow can pause (i.e., stop) for an amount of time consistent with the amount of material to be removed at that particular location on the photomask. Generally, an increase in pause time is associated with an increase in the amount of material that is trimmed or etched from the location.

Reactive species flow movement is generally accomplished by movement of a photomask associated with a movable stage in either an x or y dimension. Thus, the reactive species flow generally remains stationary while the photomask associated with a movable stage translocates in an x or y dimension. However, it is understood that the methods encompass reactive species flow translocation where the photomask remains stationary and the reactive species flow-generating apparatus is moved.

The velocity of the movable stage can be calculated as the reciprocal of local pattern density when the reactive species flow (e.g., plasma) contact area is comparable to the impact range of the etch loading effect. As previously noted, loading effect is the dependence of etch rate on the amount of available surface area, i.e. the concentration of active species decreases as the trimmable or etchable surface area increases.

When the distribution of plasma or other suitable reactive species in contact with the photomask is similar to the impact range of etch loading effect, a velocity map can be calculated so that the reciprocal of the velocity of continuous plasma movement in an x or y dimension is proportional to the amount of trimming required to increase CD uniformity of the photomask. As previously noted, the material associated with a photomask may be trimmed or etched by a reactive species flow that remains stationary for a predetermined amount of time.

For example, when the distribution of plasma or other suitable reactive species in contact with the photomask is smaller than the impact range of etch loading effect, a velocity map can be calculated so that the reciprocal of the velocity of plasma movement in an x or y dimension is proportional to the amount of trimming or etching is required to increase CD uniformity of the photomask. The standard deviation of plasma distribution is determined by:

$$\sqrt{\sigma_L^2 - \sigma_T^2},$$

where $\sigma_L$ and $\sigma_T$ are the standard deviation of the interaction range of etch loading effect and reactive ion trim distribution, respectively.

A velocity map can be calculated as a function of coordinates in an x or y dimension. The coordinates are acquired with regard to the pattern density related to a particular coordinate on a material associated with a photomask. For example, a computer implementing a method described herein can include information related to the pattern density of a photoresist material or absorber material associated with a photomask at a particular coordinate. The computer may implement a method such that the velocity of the continuous movement of a reactive species flow in contact with the material can be reciprocally proportional to the amount of CD required to trim the material at the target coordinate.

The computer can implement a method such that the movement of the reactive species flow is discontinuous by moving the movable stage to a particular position. A plasma flow of specific duration and intensity can be directed at the material to be trimmed or etched. Once trimming or etching at the chosen position is completed, the computer may implement the movement of the stage to the next position in need of trimming or etching. Alternatively, the computer can initiate or resume a continuous movement of the plasma in an x or y dimension associated with the photomask.

Methods that address potential CD non-uniformity associated with photomask processing prior to absorber etching are provided. The methods function to reduce CD non-uniformity absent, for example, photoresist CD measurement. Alternatively, the method can be used in conjunction with a method that detects CD non-uniformity by measuring the photoresist CD prior to trimming. The information derived from such a measurement can be used to create a velocity map of the photoresist. The velocity map can be used to implement additional processes culminating in the modification of the CD non-uniformity, as described above.

Potential CD non-uniformity associated with absorber processing subsequent to etching and CD measurement are addressed. Methods that function to reduce CD non-uniformity and are used in conjunction with a method that detects CD non-uniformity by measuring the absorber CD prior to modification with a reactive species flow are provided. The information derived from such a measurement can be used to create a velocity map. The velocity map can be combined with the CD measurement information to implement additional processes culminating in the modification of the absorber CD non-uniformity.

A photomask can be inspected for CD uniformity using a conventional inspection device. Numerous systems for photomask inspection have been developed are known to those skilled in the art. For example, an inspection device that optically detects the features printed on the photomask and compares such printed features with the corresponding data on the data tape used to make the photomask is currently in use.

According to another embodiment, an article comprising a machine-readable medium including machine-executable instructions operative to cause a machine to perform a process disclosed herein is provided. The article can be, for example, a computer. The machine-readable medium can be, for example, a medium or device such as ROM, CD-ROM, tape, or magnetic diskette readable by a general or special purpose computer. The machine-readable medium can be configured so as to cause a machine, such as an apparatus described herein, to operate in a specific and predefined manner to perform the functions related to photomask modification. Machine-executable instructions can include, for example, algorithms useful for modifying a photomask. Such algorithms can be implemented in one or more computer programs executed on programmable computers 110 each comprising at least one processor, at least one data storage system (including volatile and non-volatile memory and/or storage elements), at least one input device, and at least one output device. Program code is applied to input data to perform the functions described herein and generate output information. The output information is applied to one or more output devices, such as an apparatus described herein, in known fashion.

In general, algorithms and methods are provided for generating a velocity map of a photomask. Information related to the pattern density associated with a photomask at a particular coordinate can be included. In addition, CD measurement information can be included. The algorithms and processes provided herein are implemented such that the velocity of movement of a reactive species flow in contact with a material associated with a photomask can be reciprocally proportional to the amount of CD reduction required at coordinates determined in an x and y dimension. The coordinates are acquired with regard to the pattern density related to a particular coordinate on a material associated with a photomask.

With regard to photoresist or absorber modification, any information related to a pattern density associated with the photoresist or absorber can be accessed by the computer from a computer-readable storage medium. The computer can implement a modeling program that mathematically models the pattern density associated with a photoresist or absorber and integrate this information such that reactive species flow movement in an x or y dimension of the material associated with a photomask is determined. The computer can utilize the pattern density information to generate a velocity map that defines the dimension and rate of movement of the reactive species flow in contact with the material.

The computer can further integrate the velocity of reactive species flow movement with the distribution of reactive species flow in contact with the photomask. The reactive species flow in contact with the photomask demonstrates a Gaussian distribution of reactive species flow with the center of distribution located in proximity to the reactive ion outlet which is in proximity to the material being etched. Since the computer is operationally associated with various components of the apparatus, the reactive species flow distribution can be controlled, for example, by controlling the amount of gas flow into connector 20 or by modulating the distance between outlet 42 and the material associated with the photomask.

Each program may be implemented in any desired computer language (including machine, assembly, high level procedural, or object oriented programming languages) to communicate with a computer system. In any case, the language may be a compiled or interpreted language.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention. Only the embodiments of the present invention and but a few examples of its versatility are shown and described in the present disclosure. It is to be understood that the present invention is capable of use in various other combinations and environments and is capable of changes or modifications within the scope of the inventive concept as expressed herein. This application is intended to cover any variations, uses or adaptations of the invention following, in general, the principles of the invention, and including such departures from the present disclosure as come within known and customary practice within the art to which the invention pertains. Accordingly, other embodiments are within the scope of the following claims.

What is claimed is:

1. A method comprising:
   determining a local pattern density at a collection of different locations on a substrate;
   generating a reactive species flow; and
   exposing each of the locations on the substrate to the reactive species flow for a different period of time that is related to the local pattern density at the location.

2. The method of claim 1, wherein the substrate comprises a photoresist.

3. The method of claim 1, wherein said exposing comprises modifying the substrate by continuous movement of the reactive species flow across the substrate.

4. The method of claim 1, wherein said exposing comprises modifying the substrate by discontinuous movement of the reactive species flow.

5. The method of claim 1, further comprising controlling the rate of modification of the substrate by determining a distribution of the reactive species flow.

6. The method of claim 5, wherein the distribution of reactive species flow is equal to an impact range of an etch loading effect.

7. The method of claim 5, wherein the distribution of reactive species flow is less than the impact range of the etch loading effect.

8. The method of claim 7, further comprising determining standard deviation by $$\sqrt{\sigma_L^2 - \sigma_T^2},$$

wherein $\sigma_L$ is the standard deviation of the interaction range of etch loading effect and $\sigma_T$ is the standard deviation of the reactive ion distribution.

9. The method of claim 1, wherein said generating the reactive species flow comprises generating the reactive species flow from oxygen plasma.

10. The method of claim 1, wherein said generating the reactive species flow comprises generating the reactive species flow from ozone.

11. A method of modifying critical dimension of a material comprising a pattern, the method comprising:
    sampling critical dimension (CD) at a collection of different locations on the material;
    generating a velocity map describing a velocity of relative movement between the material and a reactive species source based upon the CD samples;
    generating a reactive species flow from the reactive species source; and
    exposing different portions of the pattern with the reactive species flow for different periods of time, the different periods being determined by the velocity map.

12. The method of claim 11, wherein the material is an absorber.

13. The method of claim 11, wherein said exposing comprises modifying the material by continuous movement of the reactive species flow in contact with the material.

14. The method of claim 11, wherein said exposing comprises modifying the material by discontinuous movement of the reactive species flow.

15. The method of claim 11, further comprising controlling the rate of modification of the material by determining distribution of the reactive species flow.

16. The method of claim 11, wherein the reactive species flow is generated from a plasma resulting from a mixture of oxygen and chlorine gas.

17. The method of claim 1, further comprising generating a velocity map based upon the local pattern density at the collection of locations.

18. The method of claim 17, wherein exposing each of the locations on the substrate with the reactive species flow comprises moving the substrate relative to the reactive species flow at a velocity described by the velocity map.

19. The method of claim 1, wherein exposing each of the locations on the substrate with the reactive species flow comprises etching the substrate in the contacted locations.

20. The method of claim 19, wherein an amount of etching is related to the local pattern density at each of the locations.

21. The method of claim 1, wherein determining the local pattern density comprises determining the local pattern density at the collection of locations on a mask.

22. The method of claim 1, wherein determining the local pattern density comprises determining an amount of critical dimension (CD) reduction at the collection of locations.

23. The method of claim 11, wherein exposing different portions of the pattern to the reactive species flow for different periods of time comprises differentially etching the different portions of the pattern.

24. The method of claim 23, wherein an amount of etching is related to an amount of CD reduction determined from the CD samples.

25. The method of claim 11, wherein sampling the critical dimension (CD) comprises sampling the CD at the collection of locations on a mask substrate.

* * * * *